United States Patent
Ries et al.

(10) Patent No.: US 10,648,072 B2
(45) Date of Patent: May 12, 2020

(54) VACUUM PROCESSING SYSTEM AND METHOD FOR MOUNTING A PROCESSING SYSTEM

(71) Applicant: Applied Materials, Inc., Santa Clara, CA (US)

(72) Inventors: Florian Ries, Westerngrund (DE); Stefan Hein, Blankenbach (DE); Jürgen Henrich, Limeshain (DE); Andreas Sauer, Großostheim (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 111 days.

(21) Appl. No.: 15/300,321

(22) PCT Filed: Apr. 2, 2014

(86) PCT No.: PCT/EP2014/056605
§ 371 (c)(1),
(2) Date: Sep. 29, 2016

(87) PCT Pub. No.: WO2015/149849
PCT Pub. Date: Oct. 8, 2015

(65) Prior Publication Data
US 2017/0152593 A1   Jun. 1, 2017

(51) Int. Cl.
*C23C 14/52* (2006.01)
*C23C 14/24* (2006.01)
(Continued)

(52) U.S. Cl.
CPC .............. *C23C 14/24* (2013.01); *C23C 14/52* (2013.01); *C23C 14/56* (2013.01); *C23C 14/562* (2013.01); *C23C 16/54* (2013.01); *C23C 16/545* (2013.01)

(58) Field of Classification Search
CPC .................................................. C23C 16/545
See application file for complete search history.

(56) References Cited

U.S. PATENT DOCUMENTS

| | | | |
|---|---|---|---|
| 6,350,489 B1* | 2/2002 | Moriyama | C23C 16/545 |
| | | | 427/255.5 |
| 8,117,987 B2* | 2/2012 | Haas | C23C 16/24 |
| | | | 118/718 |

(Continued)

FOREIGN PATENT DOCUMENTS

| | | |
|---|---|---|
| CN | 101601121 A | 12/2009 |
| EP | 0466999 A1 | 1/1992 |

(Continued)

OTHER PUBLICATIONS

Kurokawa, Jul. 2012, JP2012/136724—Eng machine translation (Year: 2012).*

(Continued)

*Primary Examiner* — Joseph A Miller, Jr.
(74) *Attorney, Agent, or Firm* — Patterson + Sheridan LLP

(57) ABSTRACT

A vacuum processing system for a flexible substrate is provided. The processing system includes a first chamber adapted for housing one of a supply roll for providing the flexible substrate and a take-up roll for storing the flexible substrate; a second chamber adapted for housing one of a supply roll for providing the flexible substrate and a take-up roll for storing the flexible substrate; a maintenance zone between the first chamber and the second chamber; and a first process chamber for depositing material on the flexible substrate, wherein the second chamber is provided between the maintenance zone and the first process chamber. The maintenance zone allows for maintenance access to at least one of the first chamber and the second chamber.

20 Claims, 6 Drawing Sheets

(51) Int. Cl.
     *C23C 14/56*      (2006.01)
     *C23C 16/54*      (2006.01)

(56) References Cited

U.S. PATENT DOCUMENTS

| | | | |
|---|---|---|---|
| 9,303,316 B1* | 4/2016 | Shufflebotham | C23C 14/566 |
| 2004/0089237 A1* | 5/2004 | Pruett | C23C 16/26 |
| | | | 118/719 |
| 2009/0223551 A1* | 9/2009 | Reddy | C23C 14/0629 |
| | | | 136/244 |

FOREIGN PATENT DOCUMENTS

| | | |
|---|---|---|
| EP | 1988186 A1 | 11/2008 |
| JP | 2006183070 A | 7/2006 |
| JP | 2012136724 A | 7/2012 |
| JP | 2013196848 A | 9/2013 |

OTHER PUBLICATIONS

International Search Report and Written Opinion dated Dec. 4, 2014 for Application No. PCT/EP2014/056605.
Chinese Office Action dated May 3, 2018 for Application No. 201480077772.3.
Japanese Office Action dated Dec. 29, 2017 for Application No. 2016-559546.
Chinese Office Action dated Dec. 27, 2018 for Application No. 201480077772.3.
Chinese Office Action dated Jul. 22, 2019 for Application No. 201480077772.3.

* cited by examiner

VACUUM PROCESSING SYSTEM AND METHOD FOR MOUNTING A PROCESSING SYSTEM

TECHNICAL FIELD OF THE INVENTION

Embodiments of the present invention relate to a processing system, an assembly set for a processing system and a method of mounting a processing system. Embodiments of the present invention particularly relate to vacuum deposition systems, and more particularly to roll-to-roll deposition systems and methods for mounting such deposition systems. Embodiments of the present invention particularly relate to apparatuses for processing flexible substrates.

BACKGROUND OF THE INVENTION

Processing of flexible substrates, such as plastic films or foils, is in high demand in the packaging industry, semiconductor industries and other industries. Processing may consist of coating of a flexible substrate with a desired material, such as a metal, in particular aluminum, semiconductors and dielectric materials, etching and other processing steps conducted on a substrate for the desired applications. Systems performing this task generally include a processing drum, e.g., a cylindrical roller, coupled to a processing system for transporting the substrate, and on which at least a portion of the substrate is processed. Roll-to-roll (R2R) coating systems can, thereby, provide a high throughput system.

Typically, a process, e.g. a physical vapor deposition (PVD) process, a chemical vapor deposition (CVD) process, and a plasma enhanced chemical vapor deposition (PECVD) process, can be utilized for depositing thin layers of metals which can be coated onto flexible substrates. However, Roll-to-Roll deposition systems are also experiencing a strong increase in demand in the display industry and the photovoltaic (PV) industry. For example, the use of touch panel elements, flexible displays and flexible PV modules results in an increasing demand for depositing suitable layers in Roll-to-Roll coaters, particularly with low manufacturing costs. However, such devices typically have several layers, which are typically manufactured with CVD processes and particularly also PECVD processes.

The arrangement of several CVD, PECVD and/or PVD sources in one or more process chamber(s) needs an excellent and efficient process. Commonly, the deposition of complex thin film layer structures is performed subsequently in different R2R coaters, each one designed to the needs of the special deposition technique. However, this concept results in high costs of ownership (CoO) for the manufacturing equipment.

Examples of products made of a coated substrate are OLED displays, which have received significant interest recently in display applications in view of their faster response times, larger viewing angles, higher contrast, lighter weight, lower power, and amenability to flexible substrates, as compared to liquid crystal displays (LCD). In addition to organic materials used in OLEDs, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel displays (FPD), electrically pumped organic lasers, and organic optical amplifiers.

Over the years, layers in e.g. display devices have evolved into multiple layers with each layer serving a different function. Depositing multiple layers onto multiple substrates may require multiple processing chambers. Therefore, there is a need in the art for an efficient method and apparatus for processing substrates in a flexible tool platform.

In view of the above, it is an object of the present invention to provide a vacuum processing system and a method for mounting a vacuum processing system that overcomes at least some of the problems in the art.

SUMMARY OF THE INVENTION

In light of the above, a vacuum processing system, an assembly for a vacuum processing system, and a method for mounting a vacuum deposition system according to the independent claims are provided. Further aspects, advantages, and features of the present invention are apparent from the dependent claims, the description, and the accompanying drawings.

According to one embodiment, a vacuum processing system for a flexible substrate is provided. The vacuum processing system includes a first chamber adapted for housing one of a supply roll for providing the flexible substrate and a take-up roll for storing the flexible substrate; and a second chamber adapted for housing one of a supply roll for providing the flexible substrate and a take-up roll for storing the flexible substrate. The processing system further includes a maintenance zone between the first chamber and the second chamber and a first process chamber for depositing material on the flexible substrate, wherein the second chamber is provided between the maintenance zone and the first process chamber. According to embodiments described herein, the maintenance zone allows for maintenance access to or of at least one of the first chamber and the second chamber.

According to another embodiment, a method for mounting a vacuum processing system is provided. The method includes providing a processing system having a first chamber, a second chamber, a first process chamber and a maintenance zone between the first chamber and the second chamber according to embodiments described herein; and mounting a second process chamber to the processing system, wherein the first chamber of the processing system is provided between the second process chamber and the maintenance zone.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Figure 1:
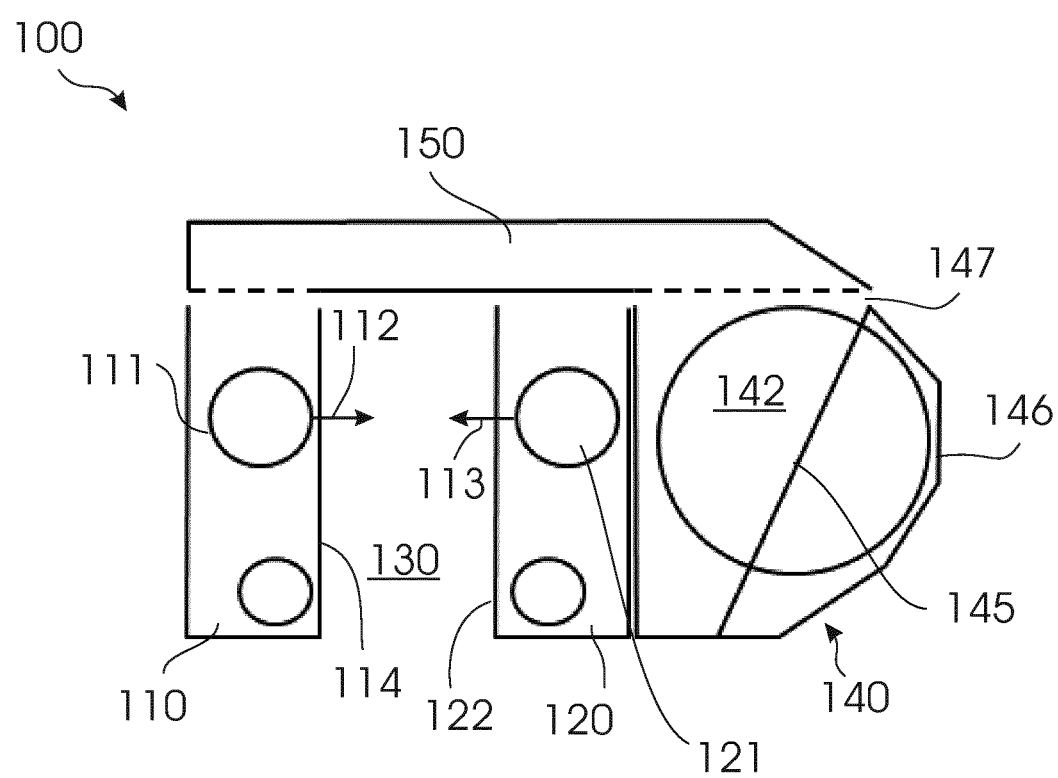
FIG. 1 shows a schematic side view of a vacuum deposition system according to embodiments described herein.

FIG. 1 shows a vacuum processing system 100 according to embodiments described herein. According to some embodiments, the processing system as described herein may be adapted for a flexible substrate, in particular for guiding and processing a flexible substrate. The processing system 100 may include an unwinding chamber 120 (or unwinding module) for housing a supply roll 121.

According to some embodiments described herein, a substrate supplied by the supply roll 121 is guided within the un-winding chamber and to a process chamber 140. The process chamber 140 may be adjacently arranged to the un-winding chamber 120. As shown in the embodiment of FIG. 1, a process roll 142, which may be designed as a coating drum, is arranged in the process chamber 140 for guiding the substrate during the process performed in the process chamber.

After having passed the process roll 142, the substrate leaves the process chamber 140. In the embodiment shown in FIG. 1, the substrate is guided from the process chamber 140 to a passage way 150 (which may also be designed as a tunnel, as will be explained in detail below). According to some embodiments, the passageway 150 connects the process chamber 140 with a winding chamber 110 (or winding module). In the winding chamber 110, the processed substrate is wound on a take-up roll 111.

A maintenance zone 130 is provided between the winding chamber 110 and the un-winding chamber 120.

A maintenance zone as referred to herein should be understood as a zone allowing for maintenance of one or more chambers of the processing system. In some embodiments, the maintenance zone may allow for monitoring, controlling, maintaining, cleaning, or exchanging components present in one or more of the chambers of the processing system.

Further, the term "maintenance zone" may be understood as a zone allowing for maintenance performed by an operator. According to embodiments described herein, the maintenance zone allows for maintenance access of or to a chamber. For instance, the maintenance zone may allow for accessing an un-winding chamber or a winding chamber. Maintenance access can include visual maintenance, access to electronic units for control of signals or receiving signals, or physical entry. According to embodiments, the maintenance zone provides atmospheric conditions.

According to embodiments described herein, a vacuum processing system for a flexible substrate is described, of which examples are shown in the discussed figures. According to some embodiments described herein, the vacuum processing system may be a vacuum deposition system. The processing system includes a first chamber and a second chamber, each of which housing one of a supply roll for providing the flexible substrate and a take-up roll for storing the flexible substrate after processing. In some embodiments, the first chamber includes a take-up roll and may be denoted as a winding chamber, such as winding chamber 110 in FIG. 1. According to some embodiments, the second chamber may include a supply roll and may be denoted as an un-winding chamber, such as unwinding chamber 120 in FIG. 1. The vacuum processing system further includes a maintenance zone between the first chamber and the second chamber. In FIG. 1, the maintenance zone 130 is arranged between the un-winding chamber 120 and the winding chamber 110.

According to embodiments described herein, the processing system includes a first process chamber for processing the flexible substrate. As can be seen in the example of FIG. 1, the second chamber 120 is provided between the maintenance zone 130 and the first process chamber 140. The maintenance zone being arranged between the first chamber and the second chamber allows for maintenance access of or to the first chamber and/or the second chamber before, e.g. after or during operation of the vacuum processing system.

As mentioned before, an un-winding chamber may include a supply roll for a substrate. A supply roll should be understood as a roll on which a substrate to be processed is stored. A winding chamber of the processing system as described herein may include a take-up roll. A take-up roll as described herein may be understood as a roll adapted for receiving the processed substrate, e.g. receiving the substrate after a deposition process.

However, although embodiments described herein refer to the first chamber as a winding chamber or re-winding chamber and the second chamber as a un-winding chamber, it should be understood that the first chamber as referred to herein may be used as an un-winding chamber with a supply spool and the second chamber may be used as a re-winding chamber with a take-up spool.

A process chamber as described herein should be understood as a chamber in which a process takes place. For instance, in a process chamber, a deposition process may take place for depositing material on a substrate. However, a process chamber may also be adapted for alternative or additional processes as will be explained in detail below.

According to some embodiments, the process chamber may house process components. In some embodiments, the process chamber may include components for depositing material on the substrate, for heating, cooling, pre-treating, cleaning the substrate and the like. In some embodiments, the process chamber may include a deposition source for depositing a material on the substrate, a heating device (such as a heating lamp, e.g. an infrared lamp), a cooling channel in the process roll, cleaning devices, pre-treatment devices such as devices for preparing the substrate for the process to be performed at a later stage, e.g by a plasma pre-treatment, etching devices and the like. According to some embodiments, a pre-treatment plasma source, e.g. an RF plasma source can be provided to treat the substrate with plasma. For example, the pre-treatment with a plasma can provide for a surface modification of the substrate surface to enhance film adhesion of a film deposited thereon or can improve the substrate morphology in another manner to improve processing thereof.

According to yet further embodiments, which can be combined with other embodiments described herein, the processing system 100 may include a pre-heating unit to heat the flexible substrate before processing. For instance, a radiation heater, an e-beam heater or any other element to heat the substrate prior to processing thereof can be provided.

In the case that a deposition process is to be performed in the process chamber, the process component(s) in the process chamber may include one or more deposition sources. According to some embodiments, the deposition source may be deposition sources for a CVD process, a PVD process, a PECVD process, a microwave plasma process, or the like.

Accordingly, the process chamber may be adapted for a CVD process, a PVD process, a PECVD process, a microwave plasma process, a sputter evaporator or the like. For instance, the process chamber may include further components useful for performing the above named processes, such as a power supply, a gas supply, a vacuum pump, a plasma generating system, and the like. Further, the chamber may be designed so as to be suitable for a plasma process, e.g. by choosing a suitable material for the chamber walls and additional chamber components (such as separating walls, covers, and supporting elements), by choosing a suitable chamber shape for a plasma process (such as a shape avoiding or reducing contaminations) and the like.

According to some embodiments, which can be combined with other embodiments described herein, the process chamber can include a plasma enhanced chemical vapor deposition (PECVD) source. The plasma enhanced deposition sources can be operated at a frequency of 2 MHz to 90 MHz, for example a frequency of 40.68 MHz, and an integrated impedance sensor can provide for real time in-line process monitoring and control of respective process parameters, for example, the width of the slit of the gas separation unit and/or the distance of the electrode of the deposition source from the substrate.

In some embodiments, the deposition sources may be adapted for depositing a thin film on a flexible substrate. For instance, a plasma deposition source can be adapted for and can be used for depositing a thin film on a flexible substrate, e.g., to form a flexible TFT, a touch screen device component, or a flexible PV module.

Figure 2:
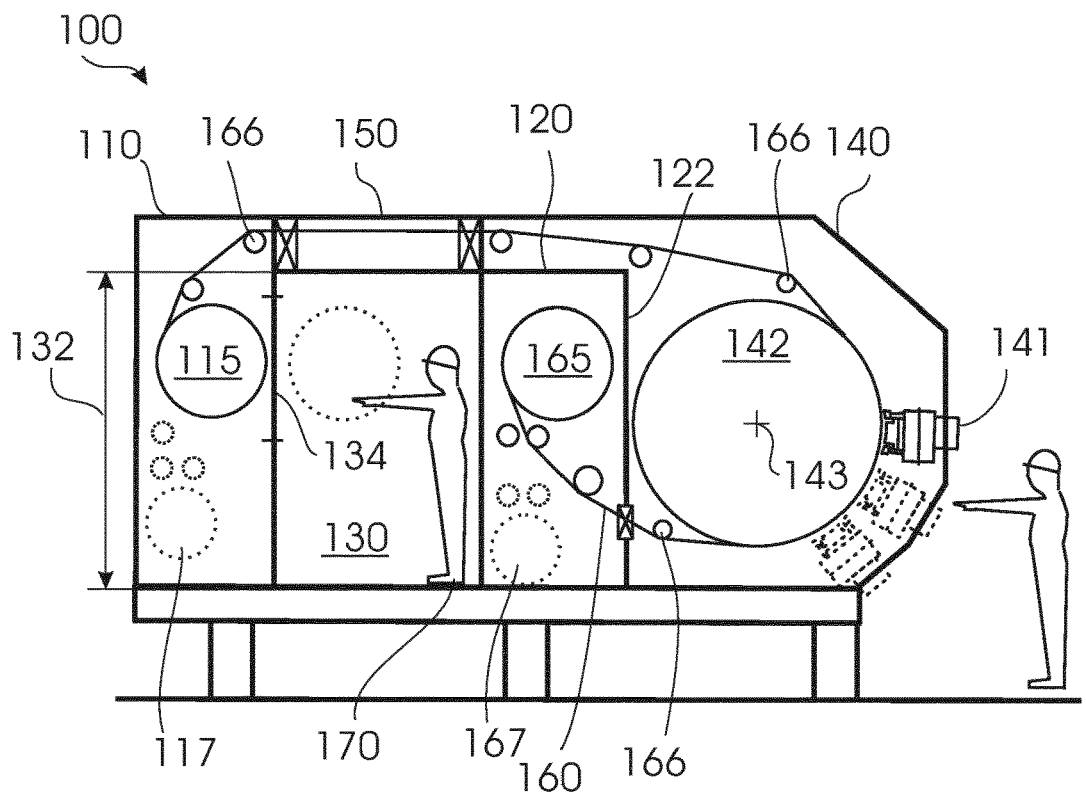
FIG. 2 shows a schematic sectional view of a vacuum deposition system according to embodiments described herein.

According to some embodiments, the first process chamber and/or the second process chamber may be adapted to allow deposition of a material on the substrate in a direction bottom-up or horizontally. The processing system being used as a deposition system can be provided with bottom-up deposition sources such that particle generation on the substrate is avoided. Particularly for processing or coating drum applications, bottom-up deposition sources can be understood as deposition sources being arranged at the height of or below a rotation axis of the coating drum. In FIG. 2, the rotation axis is shown with reference number 143.

According to some embodiments, the outer shape of the process chamber 140 may be adapted to the bottom-up arrangement of the deposition sources. For instance, the outer shape of the process chamber 140 may have a segmented shape, such as a segmented shape taking into account the position of each deposition source possibly arranged in the process chamber during processing. In some embodiments, the outer shape of the chamber may have a bent or a polygonal-like shape, as can be seen in FIG. 2.

According to some embodiments, the process chamber may include one or more support device(s) for supporting or holding a process component in the process chamber. In some embodiments, the support device may be suitable for holding a process component in a fixed position for a predetermined time interval and within predetermined tolerances. In one example, the process chamber may include a support device for supporting or holding the above described process components, such as a deposition source for depositing a material on the substrate, a heating device (such as a heating lamp, e.g. an infrared lamp), cleaning devices and pre-treatment devices such as devices for preparing the substrate for the process to be performed at a later stage. In some embodiments, the support device may include a clamping device, a gripping device, a table, fixtures, carriers, fasteners, attachment devices, adapter equipment and the like.

According to yet further embodiments, which can be combined with other embodiments described herein, a process chamber of the deposition system can have compartments or openings, wherein process components, such as deposition sources or deposition stations having deposition sources can be positioned in respective openings or respective compartments such that the different kinds of deposition sources are separated within a process chamber.

The process chamber may further include a process roll configured for supporting the substrate during processing (as can be seen in FIG. 1 by process roll 142). The process roll may support and/or guide the substrate during processing past the process components present in the process chamber. In one example, the process roll may be a coating drum. The coating drum may be adapted for guiding a flexible substrate past one or more process components, such as deposition sources. According to some embodiments, the coating drum can be configured to be heated and/or cooled to temperatures of about −20° C. to 400° C. For instance, the process drum may include heating and/or cooling channels.

Figure 3:
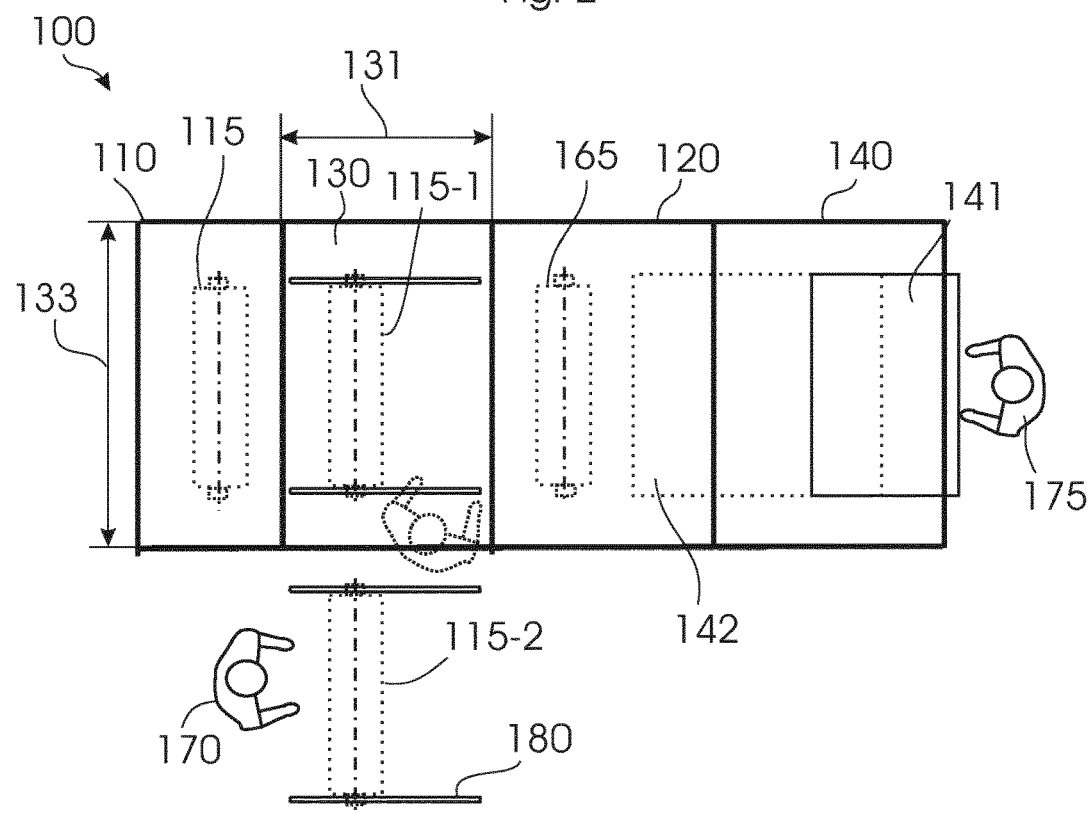
FIG. 3 shows a schematic top view of a vacuum deposition system according to embodiments described herein.

FIGS. 2 and 3 show a more detailed view of a processing system 100 according to some embodiments described herein. FIG. 2 shows a schematic, cross-sectional view of the processing system 100, whereas FIG. 3 shows a schematic top view of the processing system 100. As described with respect to FIG. 1, the deposition system includes a first chamber 110, a second chamber 120, a maintenance zone 130 and a process chamber 140.

In FIG. 2, the substrate 160 can be seen being guided from the supply roll 165 in the un-winding chamber (or second chamber) 120 to the process roll 142 in the process chamber 140, further through the passage way 150 and to the take-up roll 115 in the winding (or first) chamber 110. As mentioned before, the substrate may be a flexible substrate.

It is noted here that a flexible substrate or web as used within the embodiments described herein can typically be characterized in that it is bendable. The term "web" may be synonymously used with the term "strip" or the term "flexible substrate". For example, the web, as described in embodiments herein, may be a foil or another flexible substrate, such as a metal foil, a web or a glass substrate.

Generally, according to different embodiments, which can be combined with other embodiments described herein, the single components in the processing system, such as rolls, and deposition sources, e.g. plasma deposition sources, can be adapted for a flexible substrate, e.g., a web or a foil, or a glass substrate. For instance, the rolls may have respective surfaces and geometries for guiding, un-winding, or winding the flexible substrate.

Although FIG. 2 only shows guiding rolls 166, a winding roll 115, an un-winding roll 165, and a process roll 142, it should be understood that the process system 100 may include further rolls, rollers, or roller devices for different functions.

A roll, roller or roller device as described herein may be understood as a device, which provides a surface, with which a substrate (or a part of a substrate) may be in contact during the presence of the substrate in the processing system. At least a part of the roll as referred to herein may include a circular-like shape for contacting the substrate to be processed or already processed. In some embodiments, the roller device may have a substantially cylindrical shape. The substantially cylindrical shape may be formed about a straight longitudinal axis or may be formed about a bent longitudinal axis. According to some embodiments, the roller device as described herein may be adapted for being in contact with a flexible substrate. The roller device as referred to herein may be a guiding roller adapted to guide a substrate while the substrate is processed (such as during a deposition process) or while the substrate is present in a processing system; a spreader roller adapted for providing a defined tension for the substrate to be coated; a deflecting roller for deflecting the substrate according to a defined travelling path; a processing roller for supporting the substrate during processing, such as a coating roller or a coating drum; an adjusting roller, a winding roll, an unwinding roll or the like. The roller device as described herein may comprise a metal. In one embodiment, the surface of the roller device which is to be in contact with the substrate may be adapted for the respective substrate to be coated.

In some embodiments, the rollers 166, which guide the substrate 160 between the chambers or tunnels of the processing system as described herein, may also be configured for tension measurement. According to typical implementations of embodiments described herein, at least one tension measurement roller is provided in the processing system. Yet, two tension measurement rollers on both sides of the process roll 142 may allow for tension measurement on the winding side and the unwinding side of the process roll. Typically, the tension measurement roller is configured for measuring the tension of the flexible substrate. The substrate transport can be better controlled, the pressure of the substrate on the coating drum can be controlled and/or damage to the substrate can be reduced or avoided.

According to yet further embodiments, which can be combined with other embodiments described herein, the rollers for winding and unwinding a flexible substrate, the rollers for guiding a substrate, the processing or coating drum, and other rolls or elements in the processing system being in contact with the flexible substrate are positioned and/or arranged in the deposition chamber such that only the back side of the flexible substrate is contacted, i.e. the side which is not processed (or not to be processed) in the processing system. Thus, there is no roller based substrate front surface contact when un-winding, processing, re-winding, tensioning or guiding the substrate. This reduces contamination on the processed substrate surface, but also on the substrate surface to be processed. Also, the risk of substrate damage especially on the processed surface is reduced.

According to some embodiments, the wrapping angle of the substrate around the coating drum may typically be less than 180°, more typically less than 170°, and even more typically less than 150°. The substrate may be guided through the process chamber without touching the processed substrate surface (e.g. the surface of the substrate having a layer deposited on it).

According to typical implementations, the sum of the wrapping angles of all the rolls present in the process system can be between 180° and 540°, for example between 180° and 360°. In some embodiments, e.g. if a second process roll is provided, the sum of the wrapping angles of all rolls being present in the deposition system (except the supply and take-up roll) may be equal to or below 540°. In some embodiments, the sum of the wrapping angles of all rolls being present in the deposition system (except the supply and take-up roll) may be below 360°. According to some embodiments, as explained above, the rollers of the deposition system are arranged to provide for a substrate guiding system, which contacts the substrate only on the backside thereof, i.e. on the non-processed side. Typically, the number of guiding rollers is 2 or above and 10 or below, especially when a low total wrapping angle (such as a wrapping angle of below 360°) is desired.

As can be seen in the example of FIG. 1, the process chamber may include an inclined flange 145. In some embodiments, the process chamber is divided in at least two parts being connected by the inclined flange 145 and forming the process chamber when assembled. The first part 146 of the process chamber 140 being connected to a second part 147 of the process chamber 140 by the inclined flange 145 may house (at least partially) process components, such as deposition sources, which can be seen in FIG. 2. According to some embodiments, the first part 146 of the process chamber 140 may be adapted so that process components (such as deposition sources or tools) may externally be attached to the first part. The process chamber according to embodiments described herein may provide the second part being connectable to the passage way 150, for example by being in communication with the passageway 150, or by being even a part of the passageway (as for instance shown in FIG. 6). According to some embodiments, the first part 146 and the second part 147 part of the process chamber 140 may be connectable by a flange inclined with respect to the vertical.

The inclined flange of the process chamber 140 may allow arranging process components, such as deposition sources 141 below the substrate 160 to be processed. Thus, in the case that a deposition process is performed in the process chamber, the deposition may take place from below the substrate and not from above the substrate. In some embodiments, the deposition may be performed from the horizontal direction to the substrate, as can exemplarily be seen by the deposition source 141 in FIG. 2. According to some embodiments, the deposition sources are provided at the lower half of the coating drum. No deposit down, i.e. with a source orientation above the horizontal center line of the roller 142, or the rotation axis of the process drum, is used for the deposition system according to embodiments described herein. In other words, the entire arrangement of deposition sources is provided at the height or below the height of the center axis 143 of the coating drum. In some embodiments, the deposition sources in the process chamber are arranged at the height of or below a horizontal rotation axis of the process drum. Generated particles, which could contaminate the substrate and the process, remain in the deposition stations due to gravitation. Generation of undesired particles on the substrate and/or within the deposited layer can be avoided. Particularly for processing or coating drum applications, bottom-up deposition sources can be understood as deposition sources being arranged at the height of or below a rotation axis of the coating drum. Also, a plurality of process components may be arranged within the process chamber 140 with an inclined flange compared to a process chamber having a straight partition.

According to some embodiments described herein, the inclined flange of the process chamber may provide a separation wall within the process chamber for separating process regions in the process chamber. For instance, the inclined flange shown in the figures may indicate a vacuum tight separation wall within the process chamber. In one example, the vacuum tight separation wall within the process chamber may provide a sluice or the like for passing through of the substrate. By providing a separation wall within the process chamber, the risk of contamination may be reduced, in particular when separating a region of the process chamber, in which a deposition takes place, from a region in the process chamber, in which the substrate is only guided or in which a post-treatment takes place.

According to embodiments, some of the chambers, or all chambers, of the processing system 100 may be adapted for a vacuum process. For instance, the processing system may include components and equipment allowing for generating or maintaining a vacuum in at least a part of the processing system, such as the winding chamber, the process chamber and the un-winding chamber. According to some embodiments, the deposition system may include vacuum pumps, evacuation ducts, vacuum seals and the like for generating or maintaining a vacuum at least in parts of the deposition system. In some embodiments, each of the process chamber (s), the winding chamber and the un-winding chamber may include vacuum generating and vacuum maintaining devices for generating and maintaining the vacuum in the single chambers independently from the other chambers. For instance, each chamber has its individual corresponding vacuum pump or pumping station for evacuation of the respective area.

Yet further additionally or alternatively, the tunnel or passageway may be adapted for generating and/or maintaining a vacuum therein. However, according to some embodiments, the passageway or the tunnel may be understood as being a part of the process chamber. For instance, the tunnel may not be separated from the process chamber by sluices. Thus, the tunnel may for instance be provided with the same vacuum as present in one, or both, of the process chambers. In one example, the tunnel may provide vacuum conditions being generated and maintained by the same vacuum generating means as one or both process chambers.

In one example, the un-winding chamber and/or the re-winding chamber may be vented for maintenance purposes, e.g. by opening a door or a window to the maintenance zone.

According to some embodiments, a chamber of the processing system being adapted for operating under vacuum conditions forms a vacuum tight enclosure, i.e. can be evacuated to a vacuum with a pressure of about 0.2 to 10 mbar or even to a vacuum with a pressure of $1*10^{-4}$ to $1*10^{-2}$ mbar. Different pressure ranges are to be considered specifically for PVD processes, in the $10^{-3}$ mbar-range and CVD in the mbar-range, which are conducted in different pressure regimes. Further, the chamber(s) can be evacuated to a background vacuum with a pressure of $1*10^{-6}$ mbar or below. Background pressure means the pressure which is reached by evacuation of the chamber without any inlet of any gases. Contrary thereto, according to embodiments described herein, the maintenance zone provided between 110 and 120 is under atmospheric (i.e. ambient air) condition, such that an operator can use the maintenance access.

In some embodiments, the tunnel or passageway may be adapted for being operated under vacuum conditions and/or optional controlled inert atmosphere. Alternatively, the tunnel or passageway may be operated under atmospheric, or ambient, conditions.

In some embodiments, when the substrate is guided through the chambers of the processing system, the flexible substrate is guided through a slit or an opening in the wall separating the chambers, e.g. in the wall between the second chamber 120 and the process chamber 140. In one example, the slit may be adapted for guiding the substrate from one vacuum chamber to another vacuum chamber. In other embodiments, the slit or opening may include sealing elements in order to separate, at least substantially, the pressure conditions of the two chambers linked by the slit. For instance, if the chambers being linked by the slit or opening provide different pressure conditions, the slit or opening in the wall is designed so as to maintain the respective pressure in the chambers substantially According to the embodiments described herein, at least one gap sluice or load lock valve for separating the second chamber or un-winding chamber from the process chamber is provided at a separation wall 122. The one or more gap sluices are configured such that the flexible substrate can move there through and the gap sluice can be opened and closed for providing a vacuum seal. According to typical embodiments, a gap sluice includes a roller for guiding the substrate, e.g. for redirecting the substrate movement by an angle of 10° or above. Further, an inflatable seal is provided that can be pressed against the roller of the gap sluice. The gap sluice is closed by inflating the seal and the second chamber 120 and the process chamber 140 are separated from each other in a vacuum tight manner. Thus, for instance the second chamber 120 can be vented while the process chamber 140 can be maintained under technical vacuum.

According to a further alternative implementation, the gap sluice or load lock valve can also be provided without a roller. An inflatable seal can press the substrate against a flat sealing surface. Yet, also other means for selectively opening and closing the gap sluice can be utilized wherein opening and closing, i.e. having an open substrate path and a vacuum seal, can be conducted while the substrate is inserted. The gap sluice for closing the vacuum seal while the substrate is inserted allows for particularly easy exchange of the substrate, as the substrate from the new roll can be attached to the substrate from the previous roll.

Although the gaps, openings or gap sluices are described with respect to guiding the flexible substrate from the second chamber to the process chamber, the gaps, openings or gap sluices as described herein may also be used between other parts of the deposition system, such as between a process chamber and a passageway, between a passageway and the winding (or first) chamber, and/or between the process chamber and the first chamber.

According to some embodiments, the process system 100 includes a passage way 150. In some embodiments, the passageway is arranged above the un-winding chamber 120 and/or the re-winding chamber 110. In other embodiments, the passage way may be formed as a tunnel located below the un-winding chamber 120 and/or the re-winding chamber 110. The passageway (or the tunnel) may be used to guide the flexible substrate, e.g. after processing the substrate in the process chamber. According to some embodiments, the flexible substrate may be guided through the passageway from the process chamber to the first chamber or winding chamber. According to some embodiments, the passageway or tunnel may be adapted for guiding the substrate under vacuum conditions, e.g. by providing respective seals, pumps, sluices and the like. In some embodiments, the passageway may be under atmospheric conditions during operation of the deposition system. Operating the passageway under atmospheric conditions may spare costs and effort. According to some embodiments, sluices may be provided in the passageway, such as one sluice at the position, where the substrate enters the passageway from the process chamber and one sluice, where the substrate exits the passageway to the winding chamber.

In some embodiments, the passageway or tunnel being provided for guiding the substrate from one chamber to another chamber of the deposition system, may provide several adaption possibilities. For instance, the passageway or tunnel may be equipped with adaption devices for providing measuring devices in the tunnel. In some examples, the passageway or tunnel may be adapted for including temperature sensors, pressure sensors, tension sensors for the substrate, visual control devices, substrate control devices and the like.

In some embodiments, the passage way (or tunnel), the first chamber and the second chamber encompass the maintenance zone. In one example, the passage way may be provided in, by or as a topside lid, which extends above the maintenance zone. In another example, as mentioned above, the passage way may be provided in, by or as a bottom side tunnel extending below the maintenance zone.

As mentioned above, a top view of the deposition system 100 as shown in FIG. 2 can be seen in FIG. 3. In the example of FIG. 3, the operator 170 is changing the take-up roll 115 of the first chamber 110, which is also denoted as winding chamber, through the maintenance zone 130. The take-up spool 115 is shown in dashed lines in different positions. According to some embodiments, a control signal may inform the operator 170 about the necessity to change the take-up roll in the first chamber 110. As can be seen in FIG. 3, the maintenance zone 130 offers a good accessibility for exchanging the take-up roll 115.

Generally, although only the process of changing the take-up spool is described, the maintenance zone also offers a good accessibility for substrate feed-in and feed-out between the coating processes. Thus, also the supply roll 165 may be exchanged in the way shown in FIG. 3.

The maintenance zone may be understood as a zone allowing for maintenance performed by an operator. According to embodiments described herein, the maintenance zone allows for maintenance access of or to a chamber. For instance, the maintenance zone may allow accessing an un-winding chamber or a winding chamber. In some embodiments, the maintenance zone may allow for controlling, cleaning or exchanging components present in one or more of the chambers of the processing system, to which the maintenance zone permits access. In some embodiments, the maintenance zone may offer access to control elements, such as switches, buttons, control dials, monitors, actuators, modulators and the like for influencing the process in the chambers of the processing system. In one example, the maintenance zone may have a switch for terminating the winding or un-winding process. In other or further embodiments, the maintenance zone may have control elements for controlling environmental conditions in the first and or second chamber, such as temperature, pressure, humidity, and the like. According to embodiments, the maintenance zone provides atmospheric conditions.

In some embodiments, the maintenance zone allows for maintenance access to or of at least one of the first chamber and the second chamber during operation, e.g. while the process chamber is evacuated to a pressure of 10 mbar or below. For instance, maintenance access may be provided during operation in form of serving or activating control elements, or in form of visual control, or the like. However, it should be understood that the maintenance of the supply roll and the take-up roll in the form of removing, exchanging, or providing the supply roll or the take-up roll, i.e. maintenance task for which one or more of the winding/un-winding chambers are vented and/or opened cannot be performed during the operation, i.e. processing action, of the processing system. However, the maintenance zone, which allows for the maintenance access for maintenance of the supply roll and the take-up roll in the form of removing, exchanging, or providing the supply roll or the take-up roll, and/or for cleaning of the interior of one or more of the vacuum chambers adjacent to the maintenance zone remains at atmospheric pressure also when the one or more process chambers, which may be vented and/or opened for maintenance access, are evacuated, e.g. to a pressure of 10 mbar or below.

According to some embodiments, the maintenance of the supply roll and the take-up roll in the form of removing, exchanging, or providing the supply roll or the take-up roll, i.e. maintenance task for which one or more of the winding chambers are vented and/or opened may be performed while the web or foil remains in the one or more process chambers. According to some embodiments, the processing action of the processing system is stopped and the web or foil transport rollers are inactivated. The web or foil may then be clamped in by vacuum tight valves or gap sluices between the process chamber and the winding/un-winding chamber, such as by clamping the web in by an inflatable seal between the process chamber and the winding/un-winding chamber. In some embodiments, the web is cut in the winding/un-winding chamber after being clamped between the process chamber and the winding/un-winding chamber. The supply roll and/or the take-up roll are removed and/or exchanged. A newly added web being provided by a supply roll may be fixed (such as adhered or glued) to the cut end of the web in the un-winding chamber. In this case, the one or more of the winding chambers are vented and/or opened while the one or more process chambers are kept under vacuum and maintenance is performed in the winding/un-winding chamber while vacuum is kept in other parts of the processing system.

According to some embodiments, the maintenance zone 130 may be adapted for typical maintenance steps of the first chamber, the second chamber and/or even the tunnel above the first and/or second chamber. For instance, the size of the maintenance zone 130 may be adapted to the size of an operator 170. Further, the size of the maintenance zone 130 may be chosen so that the operator may remove the supply roll and/or the take-up roll from the first and the second chamber. According to some embodiments, the maintenance zone may have a length 131 (as can be seen in FIG. 3) of more than 1 m. According to some embodiments, the maintenance zone may have a length 131 of typically between about 1 m and about 3 m, more typically between about 1.5 m and about 2.5 m and even more typically between about 1.5 m and about 2 m. Further, the maintenance zone may have a height 132 (as can be seen in FIG.

2) of more than 1.7 m. According to some embodiments, the maintenance zone may have a height 132 of typically between about 1.7 m and about 3 m, more typically between about 2 m and about 3 m and even more typically between about 2 m and 2.5 m. Further, the maintenance zone 130 may have a depth 133 (as can be seen in FIG. 3) dependent on the substrate width. In some embodiments, the depth 133 of the maintenance zone 130 may be more than 0.7 m. According to some embodiments, the depth 133 of the maintenance zone may be typically between about 1.0 m and about 4.0 m, more typically between about 2 m and bout 3.5 m and even more typically between about 2 m and about 3 m.

As indicated by a take-up roll 115-1 with dashed lines in maintenance zone 130, the maintenance zone allows the operator 170 to handle the take-up roll removed from the first chamber 110. According to some embodiments, the size of the maintenance zone 130 may be a compromise between easy access to the chambers for maintenance purposes and the space available for the deposition system. In some embodiments, the guiding roller system in the deposition system as described herein, and especially the number of guiding rollers, is adapted to the size of the maintenance zone.

In some embodiments, the maintenance zone is provided and configured so that the first chamber and/or the second chamber can be accessed from a radial direction of the first chamber and from a radial direction of the second chamber, respectively. The maintenance zone allows for accessing the first chamber and/or the second chamber from the radial direction of the supply roll and take-up roll, respectively. The radial direction of a chamber may correspond to the radial direction of one of the supply roll or take-up roll in one embodiment. According to some embodiments, the maintenance zone allows for accessing the first chamber and/or the second chamber from the radial direction of a winding shaft for the supply roll and the take-up roll, respectively. Particularly, the maintenance zone can allow for accessing the first chamber (see e.g. 110 in FIG. 1), e.g. the vacuum chamber with the supply roll, and for accessing the second chamber (see e.g. 120 in FIG. 1), e.g. the vacuum chamber with the take-up roll, from a respective first radial side and a respective second radial side, wherein the first radial side and the second radial side faces each other. For example, a supply roll can be removed radially towards the take-up spool and vice versa.

According to embodiments described herein, the maintenance zone allows for maintenance access. Maintenance access can include visual maintenance (such as visual control), access to electronic units for control of signals or receiving signals, or physical entry. In one example, the maintenance access may be provided by a door, a window or an opening that can be closed by, e.g., a lid. According to some embodiments, the maintenance access may be provided by a chamber wall, such as a window in a wall of the winding or un-winding chamber.

In some embodiments, the maintenance zone may provide maintenance access through a window in a chamber wall, as shown in FIG. 2 as inspection window 134, indicated by two horizontal lines. The inspection window being exemplarily shown in the wall of the first chamber 110 may be arranged at a height that allows the substrate to be viewed, e.g. when wound on the take-up spool, or when un-wound from the supply spool. According to some embodiments, the inspection window may have a size for viewing the complete width of the flexible substrate, such as a width of typically between about 1 m and about 3 m, more typically between about 1.2 m and about 2.5 m, and even more typically between about 1.4 m and about 2.4 m. According to yet further embodiments, the inspection window may have a size for viewing the complete winding and/or un-winding process, e.g. by allowing for seeing the complete supply roll and/or the complete take-up roll. In some embodiments, the inspection window of the maintenance zone may be composed of several inspection ports that together enable the operator to have an impression of the processes in the chambers.

According to some embodiments, the maintenance zone may offer access to the first and/or second chamber, e.g. in the form of a door in a chamber wall. One or more doors may be adapted for reaching components in the first and/or second chamber, e.g. for reaching the supply roll or the take-up roll. In some embodiments, a door may include the inspection window of a chamber. According to some embodiments, which may be combined with other embodiments described herein, a door may allow an operator to enter the first and/or second chamber.

In FIG. 3, a schematic drawing of a loading- and un-loading system for the supply and the take-up spool is shown. According to some embodiments, an integrated loading- and unloading system may be provided for the deposition system as described herein. In some embodiments, a substrate handling system may include a table 180 and a move-in/out device for the take-up roll 115 and/or the supply roll. In the example shown in FIG. 3, the moving out of the take-up spool 115 is shown. For instance, the move-in/out device may be inserted by the operator 170 into the first chamber 110 in order to grip the take-up roll to be exchanged or removed. The move-out device gripping the take-up spool may be retracted from the first chamber 110 and may remove the take-up roll 115 from the first chamber 110. In one example, the move-out device may include gripping devices for gripping the take-up roll at both ends thereof to remove it from the roll support, which may, for instance, be a rotatable axle. According to some embodiments, the move-in/out device may be adapted so that the take-up roll may be removed from the first chamber without contacting the substrate wound on the take-up roll.

As can be seen in FIG. 3, when the take-up roll 115 is removed from the first chamber 110, the take-up roll is loaded on the table 180 of the substrate handling system in position 115-1 in the maintenance zone 130. The table 180 may be a lifting table, and in particular, a center lifting table. The operator 170 may move within the maintenance zone 130 so as to move the table 180 with the take-up roll 115-1 on it. The table 180 may then be removed from the maintenance zone 130 to bring the take-up roll out of the maintenance zone 130 in position 115-2. The operator 170 can thus move the take-up roll in an easy and uncomplicated way.

According to some embodiments, the substrate handling system may include alternatives to the table. For instance, a gripping tool may be used for moving the take-up roll out of the maintenance zone. In further embodiments, the take-up roll may be carried by a shaft, a support, or the like allowing the operator to handle the take-up roll. According to some embodiments, the alternatives to the lifting table may be used in the case that a tunnel extending below the maintenance zone 130 is used instead of a passageway 150 extending above the maintenance zone 130.

In some embodiments, the lifting table may form a central lifting table for loading and un-loading the substrate to and from the deposition system. The table may include a substrate support for holding the take-up roll or the supply roll together with the substrate. According to some embodiments, the lifting table may be movable between at least an upper position and a lower position. The substrate on the take-up roll being arranged in or on the substrate support may be moved out of the maintenance zone in a lower position of the lifting table. When the substrate and the lifting table are moved out of the maintenance zone (as indicated in position 115-2 of the take-up roll), the take-up roll together with the substrate may further be transported by a crane, such as an indoor-crane or overhead crane, or may be lifted, e.g., by means of a crane, such as a gantry crane or the like being part of the processing system, to a transport vehicle.

By using the substrate handling system as described herein, no moveable un- and re-winders (such as un- and re-winding devices being present within the first and second chamber during processing) are used in the deposition system according to embodiments described herein. The tools for moving and gripping the rolls can be introduced in the first and second chamber from the maintenance zone. According to further embodiments, the substrate handling system may include an integrated portal crane for lifting the roll to be removed from a chamber, e.g. in the case that the processing system uses a tunnel for transporting the substrate within the processing system.

However, by using the processing system in a design having a passageway above the maintenance zone, according to embodiments described herein, no overhead crane is used for removing the substrate from the deposition system, which spares cost and space for the user of the deposition system. Thus, the processing system according to embodiments described herein may also be used in smaller (or lower) factory buildings than systems known in the art. Also, the deposition system does not make high demands on the environment by not using an overhead crane.

It should be understood that the process of removing a roll from a chamber as described above may also be performed in reverse order, when delivering a new supply or take-up roll to the chambers.

According to some embodiments, the processing system as described herein may allow exchanging components in the processing system in an easy and uncomplicated way, as can be seen in FIG. 3. On the right side of FIG. 3, the process chamber 140 with the process roll 142 can be seen. The operator 175 of FIG. 3 has access to process components 141, such as to deposition sources. According to some embodiments, the one or more process components 141 may be grouped together so that they may be accessed as one unit or one group (e.g. a group being formed with the first part of the process chamber, as explained above with respect to the inclined flange). According to other embodiments, the single process components may be accessed one by one. The process components 141 may be exchanged, e.g. in the case that the process components are worn or consumed, or if the process should be changed. For instance, the process system according to embodiments described herein may provide the option to change the substrate width. An easy access and an easy exchange of process components may be helpful for efficiently using the process system for different process types or different substrates.

As can be seen in FIGS. 2 and 3, the first process chamber may be equipped with a plurality of process components being arranged about the process drum, such as process components as described above. The embodiment depicted in FIG. 2 includes one processing component 141, such as a deposition source with two further deposition sources being indicated by dashed lines. Yet, it is to be understood that according to yet further embodiments, which can be combined with other embodiments described herein, two or more processing components, e.g. deposition sources can be provided. For example, four, five, six, or even more, such as 8, 10 or 12 processing components, e.g. deposition sources, can be provided. The deposition sources may be provided in respective processing regions, and the substrate being supported by the process roller 142 is processed in the respective areas.

Also, different kinds of deposition techniques may be used in a processing system according to embodiments described herein. For instance, the process may include a chemical vapor deposition (CVD) process, a physical vapor deposition (PVD) process, a microwave plasma process and the like.

According to some embodiments, the processing system 100 may include an interleaf module. For instance, the un-winding chamber 120 may be equipped with an interleaf module 167 for winding up an interleaf provided for the protection of the substrate on the supply roll 165. The interleaf module may include some guiding rolls for guiding the interleaf to the interleaf take-up roll. In additional or alternative embodiments, the re-winding chamber 110 may include an interleaf module 117. The interleaf module 117 may provide an interleaf, which is wound on the take-up roll 115 together with the processed substrate for protecting the processed substrate on the take-up roll. Also the interleaf module 117 may be equipped with guiding rolls for guiding the interleaf to the take-up roll 115.

In some embodiments, an illuminating device may be provided in the first chamber and/or the second chamber. In particular, the illuminating device may be arranged in the first and/or second chamber so that the substrate to be processed, or the processed substrate, may be illuminated from one side, such as either the processed side or the non-processed side (or either the side to be processed or the side not to be processed). For instance, the illuminating device may facilitate the inspection and visual control of the substrate, which may be—as described above—performed through the maintenance zone, and in particular by a window in the chamber wall, such as window 134. In some embodiments, the illuminating device is a lamp.

Figure 4:
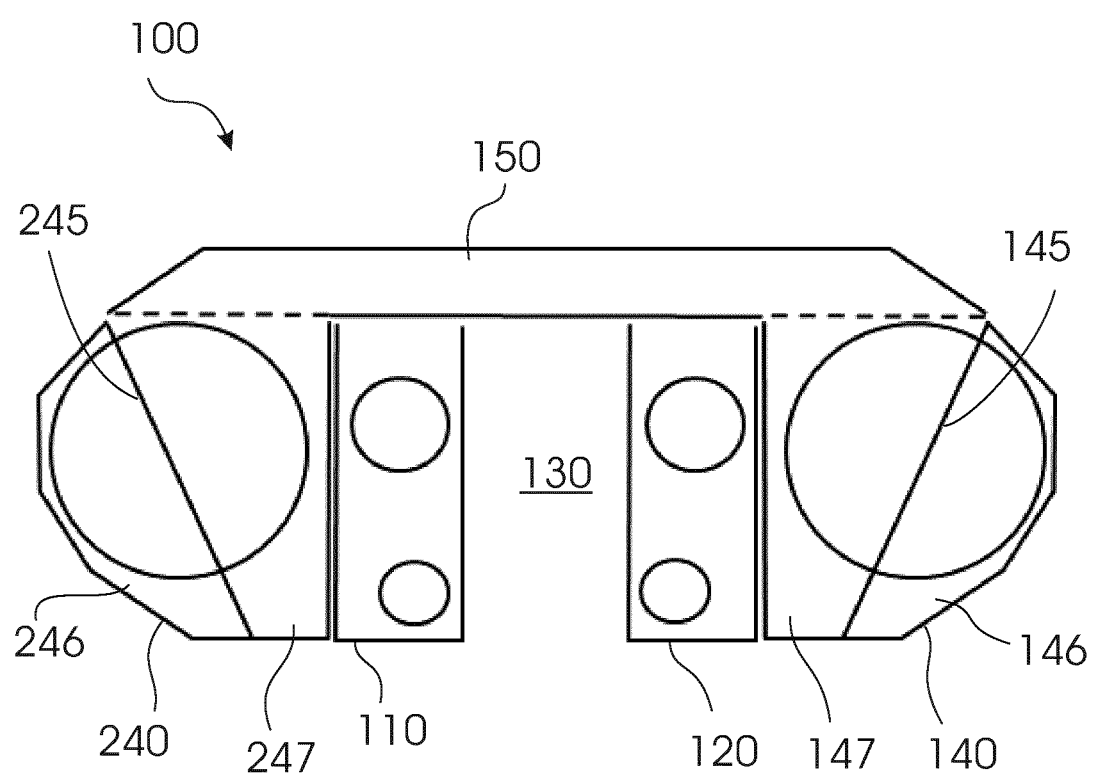
FIG. 4 shows a schematic side view of a vacuum deposition system according to embodiments described herein.

FIG. 4 shows an embodiment of a deposition system 100. The deposition system includes a first chamber 110, which may also be denoted as re-winding chamber, a second chamber 120, which may also be denoted as un-winding chamber, and a maintenance zone 130 being arranged between the first chamber and the second chamber. According to some embodiments, the first chamber 110, the second chamber 120, and the maintenance zone 130 may be as described above with respect to FIGS. 1 to 3. Further, the deposition system 100 may include further features described above with respect to FIGS. 1 to 3, such as a substrate handling system as described above with respect to FIG. 3.

As can be seen in FIG. 4, the deposition system includes a first process chamber 140 and a second process chamber 240. The first process chamber 140 may be arranged adjacent to the second or un-winding chamber, whereas the second process chamber 240 is arranged adjacent to the first or un-winding chamber 110. In particular, the second process chamber 180 may be located so that the first chamber 110 is provided between the maintenance zone 130 and the second process chamber 180.

Although in FIG. 4 and, below, in FIG. 5, the first chamber is described as being a winding chamber and the second chamber as being an un-winding chamber, the deposition system according to embodiments described herein is not limited to this arrangement. In an alternative embodiment, the first chamber may be the un-winding chamber and the second chamber may be the winding chamber.

According to some embodiments, the first process chamber 140 and/or the second process chamber 240 may be equipped with process components, such as deposition sources for a deposition process depositing material on a flexible substrate. In some embodiments, at least one of the process chambers of FIG. 4 may be equipped as the process chamber described with respect to FIGS. 1 to 3, e.g. by providing one or more supporting device(s) for deposition source(s), the deposition sources themselves and the like. The deposition system may also include a vacuum system as described above, i.e. a vacuum chamber allowing each chamber or single chambers of the deposition system 100 to be evacuated and the pressure be maintained.

The inclined flange 145 of the first process chamber 140 and the inclined flange 245 of the second process chamber 240 allow a bottom-up deposition in both process chambers, i.e. a deposition where the substrate is processed from the height of or below a horizontal center line of the mounted process chamber. This reduces the risk for particle contamination and renders the deposition process safer and more efficient. According to some embodiments, only one of the process chambers may be equipped with an inclined flange.

The inclined flange 145 separates the first process chamber 140 in two parts, a first part 146 and a second part 147. The inclined flange 245 separates the second process chamber 240 in two parts, a first part 246 and a second part 247. According to some embodiments, which may be combined with other embodiments described herein, the first part 146 of the first process chamber 140 and/or the first part 246 of the second chamber 240 may be removed from the second parts 147 and 247 of the process chambers, for instance for having easy access to the process components (e.g. deposition sources) being arranged in the process chamber(s). In some embodiments, the first part(s) of process chamber(s) may be removed for exchanging the process components.

According to some embodiments, the inclined flange of the first and/or the second process chamber may be used for providing a separation wall within the respective process chamber, such as a separation wall separating a processing region in the process chamber from a guiding region or pre- or post-treatment region in the process chamber.

As can be seen in FIG. 4, the processing system according to embodiments described herein provides the possibility to assemble the processing system in a modular manner. The processing system may be adapted to the special requirements of a process to be performed. For instance, a second process chamber 240 may additionally be mounted to a processing system 100 as described above with respect to FIGS. 1 to 3. More different processes may be combined within the processing system, e.g. by adding a second process chamber, or by varying the process components in the process chamber(s) of the processing system, which may be facilitated by providing separating walls between different process components as described above. The processing system according to embodiments described herein allows for a high flexibility for arranging the processing system. Also, the exchange of the first part as described above may be used for providing a high modularity of the processing system.

According to some embodiments, more than one deposition system may be arranged for processing one substrate in a modular architecture. For instance, after having passed the second process roll 242 in FIG. 5, the substrate may be guided by a passageway or a tunnel to a further deposition system having further process chambers.

Figure 5:
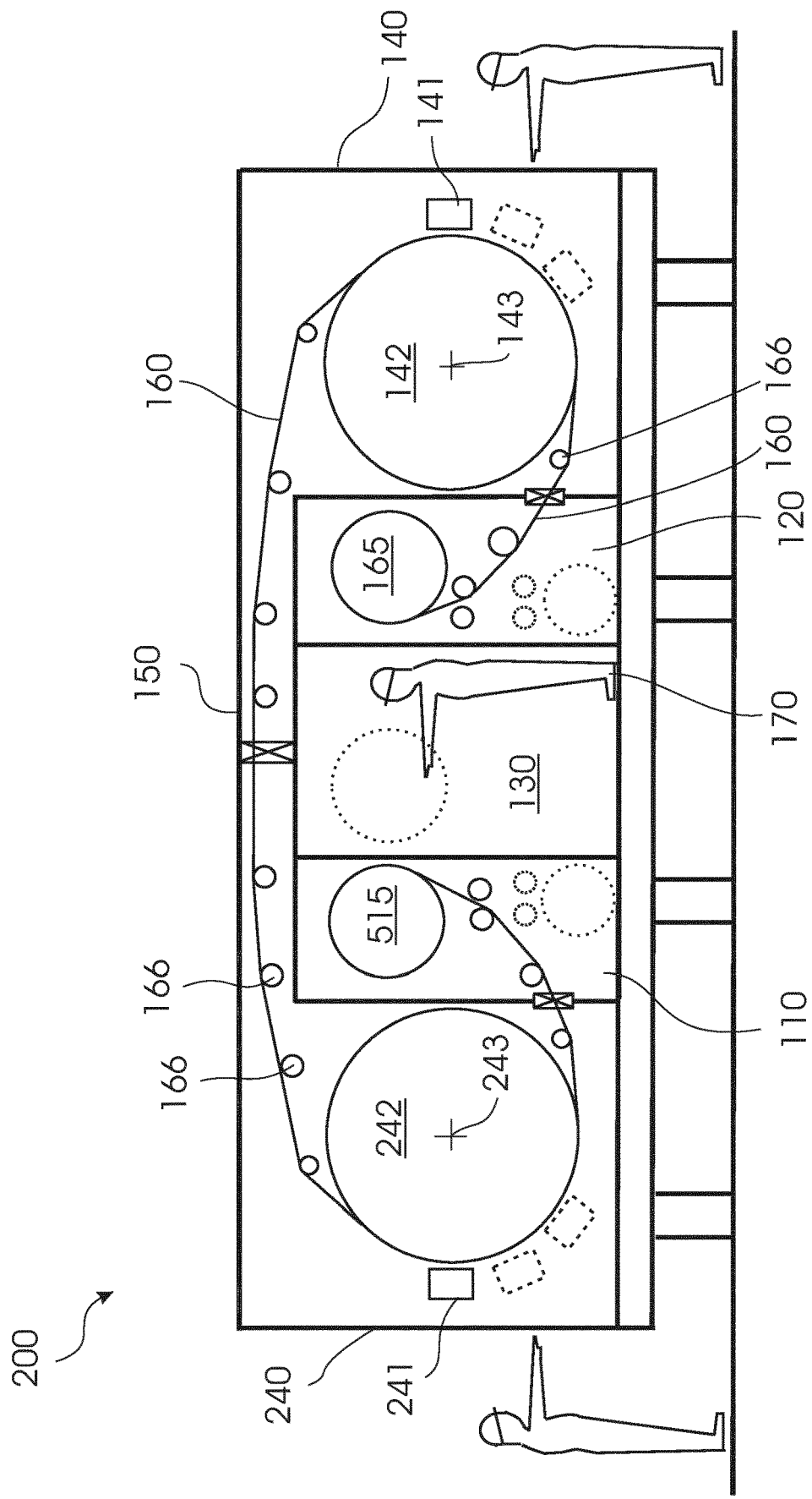
FIG. 5 shows a schematic sectional view of a vacuum deposition system according to embodiments described herein.

FIG. 5 shows a sectional view of a deposition system 100 according to embodiments described herein. In one embodiment, the deposition system shown in FIG. 5 is a sectional, more detailed view of the deposition system shown in FIG. 4. In the embodiment shown in FIG. 5, the substrate 160 to be processed is unwound in an un-winding or second chamber 120. Via guiding rolls 166, the substrate 160 is guided to the first process chamber 140 of the deposition system 100 in the shown embodiment. For processing the substrate 160 in the first process chamber 140, the substrate may be guided by a processing roll or drum 142. The processing drum 142 may be rotatable. The first process chamber 140 may include process components, past which the substrate is guided while being guided by processing drum 142. For instance, the process components may be process components as described above, such as deposition sources 141. In the embodiment shown in FIG. 5, only one deposition source 141 is shown in the first process chamber 140, while other deposition sources of the first process chamber 140 are shown in dashed lines.

As explained with respect to the embodiment shown in FIG. 3, the deposition source 141 or the deposition sources being arranged in the first process chamber 140 may be arranged at the height of or below the center axis 143 of the processing drum 142. The deposition from the sources so arranged to the substrate is effected from below the substrate, and not from above the substrate. By arranging the deposition sources at the height of or below the center axis of the processing drum, the risk of particle contamination on the substrate, or in deposited layers, is reduced. The first process drum 140 may be partitioned in two or more parts being assembled along an inclined flange 145 (as can exemplarily be seen in FIG. 4) with respect to the vertical direction for facilitating the respective arrangement of the deposition sources.

After processing the substrate, the substrate 160 is guided through passageway 150, which may be arranged above the un-winding chamber 120, the maintenance zone 130, and the winding chamber 110. In some embodiments, the passageway 150 may be part of a top lid or may be provided as a tunnel below the maintenance zone and the first and second chambers. According to some embodiments, the tunnel may include one or more sluices, which may be able to separate the pressure conditions in the first process chamber 140 from the second process chamber 180 of the deposition system 100. In some embodiments, sluices are provided at each passage from one chamber to another chamber in the process system 100, such as at the passage between the un-winding chamber to the first process chamber, between the first process chamber and the passageway, between the passageway and the second process chamber, and between the second process chamber and the winding chamber.

The one or more gap sluices may be configured as described in detail above and may be used within the process system as described above.

In some embodiments, no sluices are provided between the first process chamber and the second process chamber so that they share a common pressure condition. According to some embodiments, two process chambers having the same vacuum conditions, and therefore, are not atmospherically separated from each other, may also be denoted as one process chamber.

After having passed the passageway 150, the substrate 160 is guided (e.g. by guiding roller(s) 166) to the second process chamber 240. According to some embodiments, the second process chamber 240 may be designed as the first process chamber 140, or the process chamber described above with respect to FIGS. 1 to 3. For instance, the second process chamber may include a process drum 242 and one or more process components 241, such as deposition sources. In one example, the deposition sources 241 of the second chamber 240 may be arranged at the height of or below the center line or rotation axis 243 of the processing drum 242. The substrate may be guided by the processing drum 242 past the process components 241. In the case that the process components 241 in the second process chamber 240 are deposition sources, one or more additional layer(s) of deposited material may be coated on substrate 160. According to some embodiments, the second process chamber provides an additional or complementary component for the layer deposited in the first process chamber on the substrate.

The processing system forms a common platform for a variety of processes and PVD processes, such as evaporation or sputtering, or CVD processes, such as a PECVD process, which can be combined while the substrate is moved through the processing system. Particularly, different PECVD processes can be combined and, e.g., utilized for TFT or flexible TFT manufacturing, more particularly for ultra high barriers.

While being processed in the second process chamber 240, the substrate 160 may be guided by the process drum 242 during processing. After processing the substrate 160 in the second process chamber 240, the substrate may be guided to the first, or winding chamber 110, where the processed substrate is wound on a take-up roll 115 for storing the processed substrate. As described in detail above, the first chamber 110 and/or the second chamber 120 may be accessed through the maintenance zone 130 for maintenance of the first and/or the second chamber.

According to some embodiments, the wrapping angle of the deposition system having two process chambers may be less than 540°. As explained above, the rolls (including the guiding rollers, but not the supply roll and the take-up roll) in the deposition system having two process chambers according to embodiments described herein may be arranged so that the processed substrate surface is not touched by the rollers.

According to some embodiments, the deposition system as described herein may have a modular design. For instance, the deposition system of FIGS. 1 to 3 may be adapted so that a second process chamber may be connected, e.g. adjacent to the first chamber. For instance, the deposition system 200 may provide flanges or connection bases allowing for expanding the deposition system by connecting further chambers to the deposition system 200. In one embodiment, the first chamber 110, or re-winding chamber, may include connections and the like for mounting a second process chamber adjacent to the first chamber or winding chamber. In that way, the processing system 100 shown in FIGS. 1 to 3 may easily be transformed to the deposition system 200 shown in FIGS. 4 and 5. Further chambers may be provided for extending the operation range of the deposition system. On the other hand, the modular system allows for having a reduced size in the base shape (such as processing system 100), which fits to the needs and requirements of the user, e.g. space requirements in a factory.

The deposition system as described herein may therefore be offered with a modular mainframe design with the option "single drum (SD)" (embodiments described in FIGS. 1 to 3) and "double drum (DD)" (embodiment described in FIGS. 4 to 5) for high flexibility. The modular design also offers flexibility in number of sources. For instance, a plurality of bottom-up deposition sources may be offered, reducing the contamination risk. Deposition sources and even process chambers may be used or provided depending on process parameters, such as application type and layer stack.

Also an upgrade possibility or an upgrade set from the SD design to the DD design for existing systems may be offered when using a processing system according to embodiments described herein. For instance, an upgrade set may be installed allowing arranging the chambers as described above. For instance, an assembly operator may adapt existing systems to the DD design by providing the respective connections and components for mounting a second process chamber to the existing system. According to some embodiments, a second process chamber alignment is possible to the first process chamber (in particular if modules are assembled with topside lid).

In some embodiments, the design of the deposition system may be adapted for switching the second process chamber on and off depending on the respective application. For instance, the substrate having passed the first process chamber may be guided to the second process chamber or, optionally, to the winding chamber depending on the desired process. In one example, a control unit may activate respective guiding rollers for directing the substrate to the desired chamber. According to some embodiments, the alternative way of the substrate, such as the way to the second process chamber when the substrate is to be guided to the re-winding chamber directly after the first process, may be closed.

Accordingly, the systems described herein, having the flexibility and the space for various deposition sources, allow for a modular combination of several CVD, PECVD and/or PVD processes in a single deposition apparatus, e.g. a R2R coater. The modular concept, wherein all kinds of deposition sources including those which require very good gas separation can be used in a deposition system according to embodiments described herein, helps to bring down costs for the deposition of complex layer stacks that have to be deposited applying different deposition technologies or intricate combinations of process parameters.

According to some embodiments, the processing system may include a control unit for controlling the parameters in the deposition system. The control unit can be a controller or a control interface, which is provided outside of the chambers of the processing system. In some embodiments, the control unit is connected to sensors in the single chambers of the processing system, but may also be connected to deposition sources, the supply roll, the take-up roll and the like. The control unit may be able to calculate desired measures in the processing system. For instance, the control unit may indicate, when a change of a supply roll or a take-up roll is to be performed, e.g. via the maintenance zone. The control unit may also be able to generate an alert in case of failure of a component in the deposition system.

Figure 6:
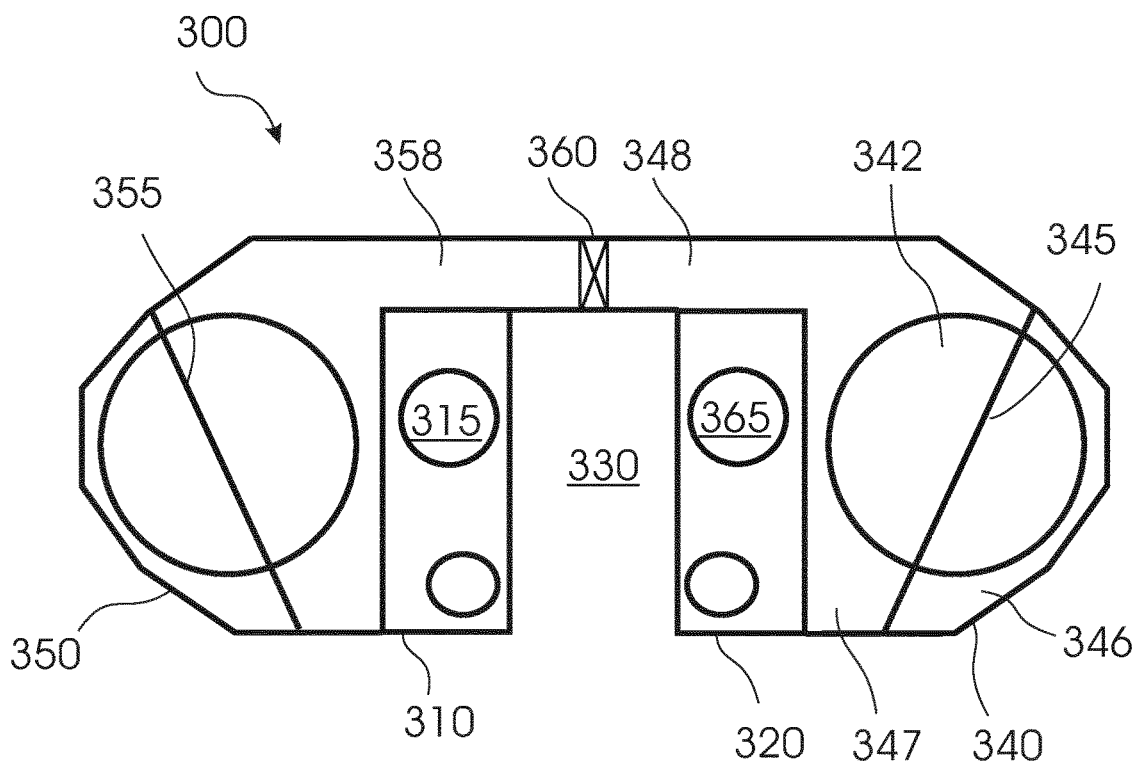
FIG. 6 shows a schematic side view of a vacuum deposition system according to embodiments described herein.

FIG. 6 shows an embodiment of a vacuum processing system 300. The vacuum processing system 300 includes a first chamber 310 and a second chamber 320, each being adapted for housing one of a supply roll and a take-up roll. In one embodiment, the first chamber 310 may include a take-up roll 315 for receiving and storing the processed substrate. According to some embodiments, the second chamber 320 may include a supply roll 365 for delivering and supplying the substrate to be processed. Between the first chamber 310 and the second chamber 320, a maintenance zone 330 is provided. According to some embodiments, the maintenance zone may be a maintenance zone as described in detail above, providing especially maintenance access to the first and/or the second chamber.

A first process chamber 340 is provided adjacent to the second chamber 320 in the embodiment shown in FIG. 6. The process chamber 340 may include process equipment as described above and may—for instance—be adapted for a vacuum deposition process. A second process chamber 350 is shown in the embodiment of FIG. 6 adjacent to the first chamber 310. As can be seen in the embodiment shown in FIG. 6, the first process chamber 340 includes an inclined flange 345 which may allow assembling the process chamber 340 from two chamber parts 346 and 347, as for instance described in detail above. Also, the second process chamber 350 may include an inclined flange 355 allowing forming the second process chamber 350 from two chamber parts. The first and the second part(s) of the process chamber(s) may be first and second parts of a process chamber as for instance described with respect to FIG. 1.

According to some embodiments, the substrate to be processed may be guided from the second chamber 320 to the first process chamber 340, e.g. by using one or more gap sluices as described above. The substrate is then processed in the first process chamber 340 and guided past a first processing drum 342 and. For instance, one or more layers may be deposited on the substrate while passing the first process chamber. According to some embodiments, and as referred to in detail above, the first process chamber may also include equipment for the pre- or post-treatment of the substrate.

In some embodiments, the substrate may further be transported to the second process chamber 350. According to some embodiments described herein, the first process chamber 340 and the second process chamber 350 are separated from each other, e.g. by a sluice, a lock, a load lock valve, or the like, allowing the substrate to pass through from one process chamber to the other. In FIG. 6, a gap sluice 360 can be seen between the first process chamber 340 and the second process chamber 350.

According to some embodiments, the process chamber(s) of a vacuum processing system as described herein, may be formed so as to provide a passageway for the substrate from the process chamber to an adjacent chamber, such as a winding chamber, or a further process chamber. As can be seen in the example of FIG. 6, the process chambers 340 and 350 provide an arm-like extension 348, 358 for providing a passageway for the substrate in the vacuum processing system, while, in particular, the first and the second chamber may have a substantially rectangular shape. According to some embodiments described herein, the passageway is thus provided by the process chamber(s) and the extension(s) thereof. In other embodiments, only one process chamber may be equipped with an extension for a passageway. According to some embodiments described herein, the passageway is thus provided above the first (vacuum) chamber and the second (vacuum) chamber.

With the embodiment of FIG. 6, the benefit of modularity of the processing system can still be realized, while at the same time, an easy maintenance access is provided as in the embodiments described above. Further, the processing system according to embodiments described herein offers a great flexibility with regard to the substrate width used.

Figure 7:
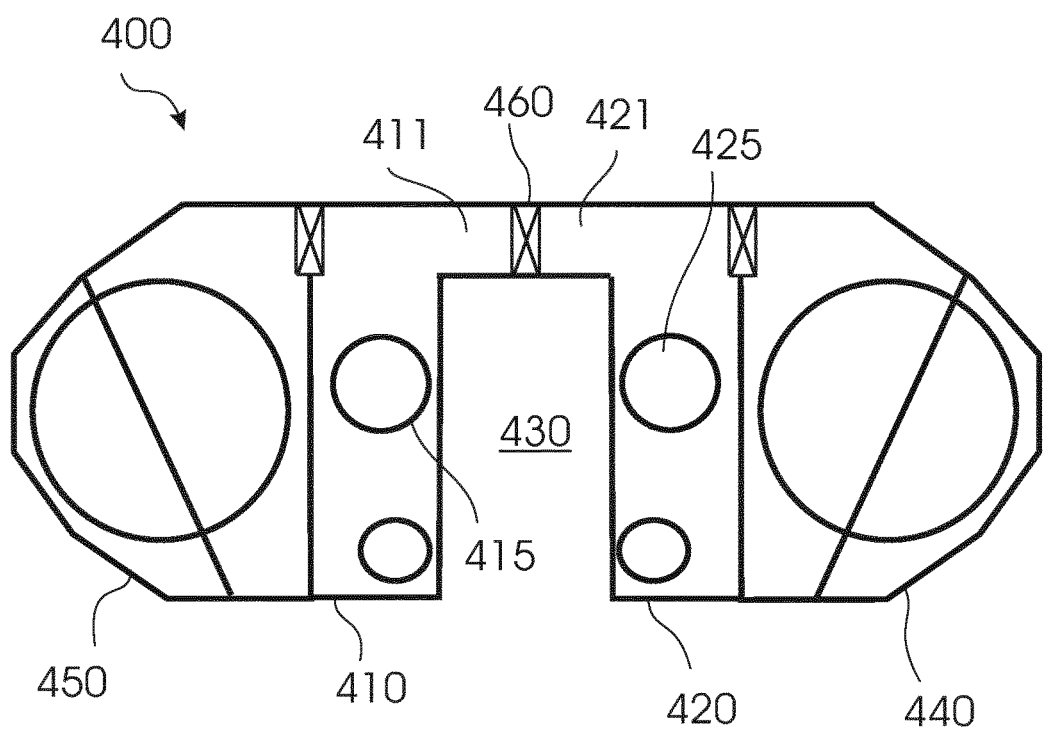
FIG. 7 shows a schematic side view of a vacuum deposition system according to embodiments described herein.

FIG. 7 shows a further embodiment of a vacuum processing system 400. The vacuum, processing system 400 includes a first chamber 410 and a second chamber 420, each being adapted for housing one of a supply roll and a take-up roll. In one embodiment, the first chamber 410 includes a take-up roll 415 for receiving and storing the processed substrate and the second chamber 420 includes a supply roll 425 for supplying the substrate. In the embodiment shown in FIG. 7, the vacuum processing system further includes a first process chamber 440 and a second process chamber 450. A maintenance zone 430, e.g. a maintenance zone as described in the embodiments above, is provided between the first chamber 410 and the second chamber 420.

A substrate to be processed may be guided from the second chamber 420 to the first processing chamber 440. After the process has been performed in the process chamber, which may for instance be a deposition process, the substrate may be further guided in the vacuum processing system. For instance, the substrate may be guided to a winding chamber (such as winding chamber 410) or to a second process chamber 450. In the embodiment shown in FIG. 7, the substrate processed in the first process chamber 440 may be guided to a passageway, which is formed by two arm-like extensions 421 and 411 of the second chamber 420 and the first chamber 410. The substrate may thus be guided from the first process chamber 440 back to the second chamber 420, especially the part of the second chamber forming partially a passageway of the vacuum processing system. Through a sluice or load lock valve 460, which may be designed as described in embodiments above, the substrate may further be transported to the arm-like extension 411 of the first chamber 410, also forming partially the passageway of the vacuum processing system. Thus, the passageway for transporting the substrate within the vacuum processing system may be mounted from two extensions of the first and the second chamber in some embodiments. Although the first chamber and the second chamber together form the passageway for the substrate, the first chamber and the second chamber are separated for avoiding contamination of each other, and, especially, of the substrate. According to some embodiments, only one of the first and the second chamber may provide the passageway of the processing system by providing an arm-like extension.

According to some embodiments, the first chamber and the second chamber may be described as having a substantial L-shape in the embodiment shown in FIG. 7, in particular, an L-shape, which fits together at the arm-like extensions 411 and 421. According to some embodiments described herein, the passageway is thus provided by the winding and un-winding chambers (i.e. the first and the second chambers). Also the embodiment of FIG. 7 provides a modular vacuum processing system, which offers the benefit of an easy access of the first and second chamber by the maintenance zone and a great flexibility with regard to the substrate width used. The single parts of the processing system 400, such as one or more process chamber(s) or the winding and the un-winding chamber, may be designed in the same manner (or at least in a similar manner) and may be removed or added to the vacuum processing system depending on the desired process without having to re-arrange the whole processing system in a complicated way. According to some embodiments, a vacuum processing system for a flexible substrate having one or more vacuum chambers is provided. The processing system includes a supply roll support for a supply roll for providing the flexible substrate in the one or more vacuum chambers; and a take-up roll support for a take-up roll for storing the flexible substrate in the one or more vacuum chambers. Further, the vacuum processing system includes a maintenance zone between the supply roll support and the take-up roll support. The vacuum processing system further includes a first process chamber for processing the substrate, in particular for depositing material on the flexible substrate. One of the supply roll support and the take-up roll support is provided between the maintenance zone and the first process chamber. The maintenance zone allows for maintenance access to at least one of the supply roll support and the take-up roll support. According to some embodiments, which can be combined with other embodiments described herein, the vacuum processing system is configured to provide a maintenance zone, which remains under atmospheric pressure even when neighboring vacuum chambers are evacuated for operation of the processing system.

According to some embodiments, the maintenance zone may be a maintenance zone as described above. In some embodiments, the maintenance zone being between supply roll support and the take-up roll support may be understood as the maintenance zone being in the space between the supply roll support and the take-up roll support. The space between the supply roll support and the take-up roll support may be defined as a volume between the supply roll support and the take-up roll support, especially the volume having a depth corresponding substantially to the width of the supply roll support and the take-up roll support (such as a depth of between about 0.7 m and about 4 m), a length of typically between about 1 m and about 3 m or 4 m, and a height of more than 1.7 m. According to some embodiments, the maintenance zone being between supply roll support and the take-up roll support may be understood in that the maintenance zone may be arranged along a virtual line running from the supply roll support to the take-up roll support, such as a line running along the length direction of the processing system, as can for instance be seen in FIG. 3 as length direction 131. In some embodiments, a center point of the maintenance zone may be arranged at a line running from a geometrical center point of the supply roll support to a geometrical center point of the take-up roll support. In particular, a roll support including more than one part, such as two devices for supporting a roll, may have the center point between the different parts of the roll support. According to some embodiments, the one or more vacuum chambers of the vacuum processing system may in particular include a first chamber for providing the supply roll support (or the take-up roll support) and a second chamber for providing the take-up roll support (or, depending on the arrangement of the first chamber, the supply-roll support). In some embodiments, the one or more vacuum chambers do not only include the supports for the supply roll and the take-up roll, but also the supply-roll and the take-up roll themselves. Also, the maintenance access to the supply roll support and the take-up roll support may include the maintenance access of the supply roll and the take-up roll.

It should be understood that the processing system having the maintenance zone between the roll supports according to embodiments described herein, may be combined with other embodiments described herein, or may be provided with features described above with respect to other embodiments. For instance, the chambers of the processing system having the maintenance zone between the roll supports, may be adapted for operating under vacuum conditions, as described above, the process chamber may be equipped for different processes including the required equipment for such processes as described above, a second process chamber may be provided in the processing system, the maintenance zone may have a size as referred to above, and the like.

According to some embodiments, a vacuum processing system is provided for processing a flexible substrate. The processing system includes a first chamber adapted for housing one of a supply roll support for supporting a supply roll for providing the flexible substrate and a take-up roll support for supporting a take-up roll for storing the flexible substrate. In one embodiment, the first chamber includes a supply-roll or a take-up roll being arranged at a roll support. The processing system further includes a second chamber adapted for housing one of a supply roll support for supporting a supply roll for providing the flexible substrate and a take-up roll support for supporting a take-up roll for storing the flexible substrate. In one embodiment, the second chamber includes a supply-roll or a take-up roll being arranged at a respective roll support. According to some embodiments, the supply roll and the take-up roll each comprise a radial direction and a longitudinal direction. The processing system further includes a maintenance zone, which allows for removing the supply roll from the supply roll support and the take-up roll from the take-up roll support from the first and the second chamber, respectively, in radial direction towards each other, in particular into the maintenance zone. The processing system further includes a first process chamber for processing the substrate, e.g. by depositing material on the flexible substrate. In particular, the process chamber may be arranged adjacent to one of the first chamber and the second chamber. Further, according to some embodiments, the second chamber may be provided between the maintenance zone and the first process chamber. In some embodiments, the maintenance zone may allow for maintenance access to or of at least one of the first chamber and the second chamber, e.g. by removing the supply roll and the take-up roll from the first chamber and the second chamber, respectively, in radial direction towards each other.

Referring back to FIG. 1, the arrows 112 and 113 indicate the radial direction, in which the supply roll 121 and the take-up roll 111 may be removed towards each other with the aid of the respectively arranged maintenance zone 130. As can be seen in FIG. 1, the arrows 112 and 113 are directed in the radial direction of the supply roll 121 and the take-up roll 111. For the sake of a better understanding, it is shortly referred to FIG. 3, where the longitudinal direction of the supply roll 165 and the take-up roll 115 runs in the direction of the depth 133 of the processing system, whereas the radial direction substantially runs in the direction of the length 131 of the processing system, keeping in mind that the supply roll and the take-up roll have a substantially cylindrical shape. In particular, the radial direction of the supply roll and the take-up roll, in which they are moved so as to be removed from the first and second chamber towards each other, may run substantially parallel to the floor on which the processing system stands, or to the chamber bottom of the first and second chamber, respectively. In some embodiments, the supply roll and/or the take-up roll may be removed from the first chamber and the second chamber, respectively, by moving the supply roll and/or the take-up roll in the radial direction of a winding shaft of the supply roll or the take-up roll. According to some embodiments, the take-up roll and the supply roll may be moved from the first and second chamber, respectively, in radial direction towards each other into the maintenance zone, especially both the supply roll and the take-up roll may be moved into the same maintenance zone of the processing system.

According to some embodiments, the term "towards each other" as used herein may mean that the supply roll and the take-up roll are moved in the direction to each other, when being removed from the first chamber and the second chamber, respectively. It should be understood that, although the supply roll and the take-up roll are described as being moved towards each other, this does not necessarily mean that the supply roll and the take-up roll are removed at the same time. Rather, the supply roll may be removed from the second chamber independently from the removal of the take-up roll from the first chamber, and vice versa. In particular, the supply roll may also be described as being removable from the second chamber towards a wall of the first chamber in some embodiments, such as wall 114 as can be seen in FIG. 1. According to some embodiments, the take-up roll may be removed from first chamber towards a wall of the second chamber, such as wall 122. In particular, walls 114 and 122 may be substantially perpendicular to the bottom of the processing system or the floor on which the processing system stands.

It should be understood that the elements of the above described processing system adapted for removing the supply roll and the take-up roll towards each other may be designed and adapted as the elements described in the various embodiments described herein. For instance, the process chamber may be a process chamber as described in detail above, the processing system may provide a second process chamber, the chambers may be adapted for operating in vacuum conditions as described above, the maintenance zone may have a size as discussed in detail above, and the like. The features of the chambers of the processing system may thus be combined with other features of the processing system described herein as far as they do not exclude each other.

According to some embodiments described herein, the processing system as described herein may have substantially vertically separated first and second chambers. For instance, FIG. 7 shows the first chamber and the second chamber as being substantially vertically separated by the sluice 460. But also other embodiments may be described as providing the first chamber and the second chamber being substantially vertically separated, e.g. by the maintenance zone.

According to yet further embodiments, which can be combined with other embodiments described herein, the first L-shaped chamber 410 and a second L-shaped chamber 420 (see FIG. 7), each being adapted for housing one of a supply roll and a take-up roll, may also be provided as one U-shaped chamber. A maintenance zone 430, e.g. a maintenance zone as described in the embodiments above, is provided between the respective portions of the U-shaped chamber. According to some embodiments, a vacuum processing system for a flexible substrate having one or more vacuum chambers is provided. The processing system includes a supply roll support for a supply roll for providing the flexible substrate in the one or more vacuum chambers; and a take-up roll support for a take-up roll for storing the flexible substrate in the one or more vacuum chambers. Further, the vacuum processing system includes a maintenance zone between the supply roll support and the take-up roll support. The vacuum processing system further includes a first process chamber for processing the substrate, in particular for depositing material on the flexible substrate. One of the supply roll support and the take-up roll support is provided between the maintenance zone and the first process chamber. The maintenance zone allows for maintenance access to at least one of the supply roll support and the take-up roll support. According to some embodiments, which can be combined with other embodiments described herein, the vacuum processing system is configured to provide a maintenance zone, which remains under atmospheric pressure even when neighboring vacuum chambers are evacuated for operation of the processing system. According to yet further additional or alternative implementations, the maintenance zone can allow for accessing a first portion of the U-shaped chamber corresponding to the first chamber 320, e.g. the vacuum chamber with the supply roll, and for accessing a second portion of the U-shaped chamber corresponding to the second chamber 310, e.g. the vacuum chamber with the take-up roll, from a respective first radial side and a respective second radial side, wherein the first radial side and the second radial side faces each other. For example, a supply roll can be removed radially towards the take-up spool and vice versa.

The processing system according to embodiments described herein may be scalable for various coating widths. For instance, the chambers may be adapted in size for several substrate widths. In one example, the processing system is adapted for a substrate width of typically more than 1 m, more typically more than 1.5 m, and even more typically more than 2 m. In one embodiment, the deposition system as described herein may be adapted for substrate width (being the extension in the plane of projection in FIGS. 3 and 5) of typically between about 1 m and about 3 m, more typically between about 1.2 m and about 2.5 m, and even more typically between about 1.4 m and about 2.4 m.

Also, components present in the chambers, such as connections for supply or take-up rolls may be adapted for different substrate widths. As can be seen from the above description, the substrate access is independent from the substrate width because of the good accessibility between un- and re-winding from the maintenance zone. Also, a high accuracy can be obtained since the winding systems (such as connections for the supply and take-up rolls) are fixedly installed in the respective chambers of the deposition system. With the access to the winding and un-winding chamber from the maintenance zone, the winding system does not have to be removed and re-positioned in the chamber for exchanging the substrate. Rather, only the substrate is removed from the winding systems, which remains in the chamber during the exchange process.

Figure 8:
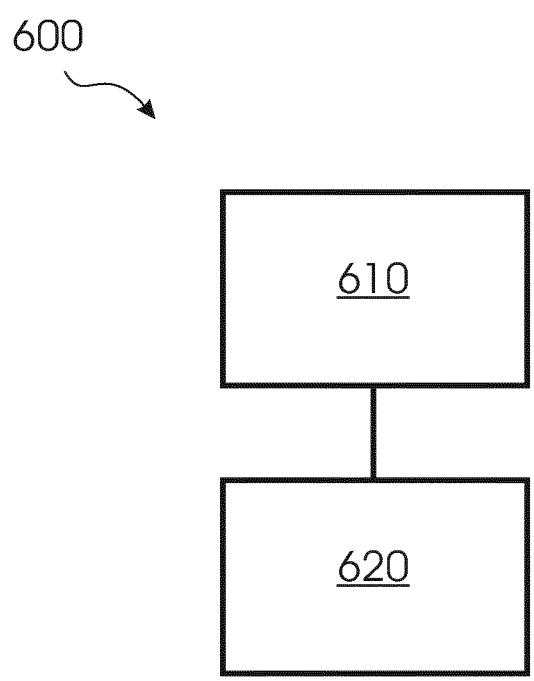
FIG. 8 shows a flow chart of a method for mounting a vacuum deposition system according to embodiments described herein.

FIG. 8 shows a flow chart of a method 600 for mounting a vacuum processing system. The method includes in block 610 providing a processing system as described in FIGS. 1 to 3. In block 620, the method 600 includes mounting a second process chamber to the processing system. As can be seen in the above description, the second process chamber may be mounted so that the first chamber, or winding chamber, is arranged between the maintenance zone and the second process chamber. The second process chamber may also be described as being mounted adjacent to the first chamber.

According to some embodiments, the second process chamber may be mounted to the processing system and sluices may be provided between the second process chamber and the first or winding chamber. According to some embodiments, the method for mounting a processing system further includes connecting the first process chamber and the second process chamber by a passage way. In some embodiments, the passage way is provided by a topside lid extending above the maintenance zone or a bottom side tunnel extending below the maintenance zone.

The tunnel or passage way may also extend between the first process chamber and the winding chamber, or the first process chamber and the second process chamber. Thus, when mounting the second process chamber, the passage way may be adapted, e.g. by providing respective sluices, or by adapting the passage way so as to reach to the second process chamber.

In some embodiments, the separate chambers of the processing system have their own vacuum generating and maintaining systems. When mounting the second process chamber, the connections of the second process chamber, such as to the re-winding chamber, may be vacuum sealed.

According to some embodiments, the second process chamber may include two or more parts being connectable by an inclined flange (inclined with respect to the vertical direction). The second process chamber may therefore be divided in a first part, which is adapted for housing—at least partially—process components such as deposition sources or the like, and a second part, which is to be connected to the passage way or tunnel. The inclined flange allows for, e.g. a bottom-up deposition, i.e. a deposition where the substrate is processed from below a horizontal center line of the mounted process chamber. This reduces the risk for particle contamination and renders the deposition process safer and more efficient.

According to some embodiments described herein, an assembly set for a vacuum processing system is provided. In some embodiments, the assembly set for a vacuum processing system may be an assembly set for a vacuum deposition system. The assembly set includes a first chamber adapted for housing one of a supply roll for providing the flexible substrate and a take-up roll for storing the flexible substrate; a second chamber adapted for housing one of a supply roll for providing the flexible substrate and a take-up roll for storing the flexible substrate; a first process chamber for depositing material on the flexible substrate, wherein the first process chamber is adapted to be structurally connectable to the second chamber; and a passage way adapted to connect the first process chamber and the first chamber, wherein the passage way is provided by a topside lid extending above the first and the second chamber or a bottom side tunnel extending below the first and second chamber. The passage way, the first chamber and the second chamber are adapted to define in an assembled state a maintenance zone between the passage way, the first chamber, and the second chamber, the maintenance zone allowing access to the first chamber and the second chamber. Further, the second chamber is adapted to be positioned between the maintenance zone and the first process chamber.

In some embodiments, the chambers may be adapted to be assembled together by providing the respective connection possibilities at the respective locations. For instance, the un-winding chamber may have a sluice to the first process chamber and the wall separating these two chambers is adapted for receiving such a sluice. In another example, the first process chamber may have an outlet in the direction of the passage way so that the substrate may be guided from the process chamber to the passage way or tunnel.

According to some embodiments, the assembly set for a processing system may further include a loading/un-loading system for providing and removing the substrate from one of the first chamber and the second chamber; and/or the first chamber, the second chamber and the first process chamber are adapted for a vacuum process and are individually evacuable; and/or the first chamber and the second chamber are adapted to provide via the maintenance zone at least one of access to the first and/or the second chamber, a control option for controlling the first chamber and/or the second chamber, a control element, and inspection of the first chamber and/or the second chamber; and/or a first part of the first process chamber adapted for housing one or more deposition sources and a second part of the first process chamber for housing a process drum, wherein the first part and the second part are adapted to be connected along a line inclined with respect to the vertical direction.

In some embodiments, the assembly set for a deposition system is an assembly set for a processing system as described above with respect to FIGS. 1 to 5. The single components of the assembly set may be components as described with respect to FIGS. 1 to 5, and may, in particular, provide the same features of the single components of the deposition system as described above.

Further, the use of a processing system as described above is provided according to embodiments described herein.

While the foregoing is directed to embodiments of the invention, other and further embodiments of the invention may be devised without departing from the basic scope thereof, and the scope thereof is determined by the claims that follow.

The invention claimed is:

1. A vacuum processing system for a flexible substrate, the vacuum processing system comprising:
    a first chamber adapted for housing one of a supply roll for providing the flexible substrate and a take-up roll for storing the flexible substrate;
    a second chamber adapted for housing one of the supply roll for providing the flexible substrate and the take-up roll for storing the flexible substrate;
    a maintenance zone located entirely between the first chamber and the second chamber, wherein the maintenance zone is configured to operate at atmospheric pressure during vacuum processing of the flexible substrate;
    a first process chamber for depositing material on the flexible substrate, wherein
        the second chamber is provided between the maintenance zone and the first process chamber,
        the first chamber and the second chamber are separate chambers,
        the maintenance zone allows for maintenance access inside the first chamber and the second chamber, and
        the maintenance zone is configured for insertion and removal of the supply roll and the take-up roll to and from the corresponding first chamber and second chamber through the maintenance zone; and
    a loading/unloading system in the maintenance zone configured to
        provide and remove the supply roll to and from at least one of the first chamber and the second chamber through the maintenance zone, and
        provide and remove the take-up roll to and from at least one of the first chamber and the second chamber through the maintenance zone.

2. The vacuum processing system according to claim 1, wherein the vacuum processing system is adapted to provide via the maintenance zone at least one of a control option for controlling the first chamber and the second chamber, a control element, and inspection of the first chamber and the second chamber.

3. The vacuum processing system according to claim 1, wherein the maintenance zone is provided so that at least one of the first chamber and the second chamber can be accessed from a radial direction of the first chamber and from a radial direction of the second chamber, respectively, wherein the radial direction corresponds to the radial direction of one of the supply roll or the take-up roll, respectively.

4. The vacuum processing system according to claim 1, further comprising a second process chamber.

5. The vacuum processing system according to claim 4, wherein the first process chamber, the second process chamber, the first chamber and the second chamber are adapted for a vacuum process and are individually evacuable.

6. The vacuum processing system according to claim 4, further comprising a passage way connecting the first process chamber to the first chamber or to the second process chamber.

7. The vacuum processing system according to claim 6, wherein the passage way is provided by a topside lid extending above the maintenance zone or a bottom side tunnel extending below the maintenance zone.

8. The vacuum processing system according to claim 1, further comprising a passage way being formed by extensions of the first chamber and the second chamber.

9. The vacuum processing system according to claim 4, wherein at least one of the first process chamber and the second process chamber comprises a process drum having a rotation axis and one or more deposition source(s), each deposition source being arranged at a height of or below a horizontal center line of the respective process chamber.

10. The vacuum processing system according to claim 4, wherein at least one of the first process chamber and the second process chamber comprises a first part providing one or more deposition sources and a second part allowing a communication with a passageway of the vacuum processing system, wherein the first part and the second part are connected along a line inclined with respect to a vertical direction.

11. The vacuum processing system according to claim 4, wherein at least one of the first process chamber and the second process chamber comprises a process drum and wherein a wrapping angle of the flexible substrate about the process drum is less than 180° during processing.

12. The vacuum processing system according to claim 4, wherein the second process chamber is located so that the first chamber is provided between the maintenance zone and the second process chamber.

13. The vacuum processing system according to claim 6, wherein the passage way is provided above or below the maintenance zone.

14. The vacuum processing system according to claim 13, wherein the passage way, the first chamber, and the second chamber partially encompass the maintenance zone.

15. The vacuum processing system according to claim 9, wherein the deposition source is arranged at a height of or below the rotation axis of the process drum.

16. The vacuum processing system according to claim 1, further comprising a passage way for transporting the flexible substrate from the first process chamber to the first chamber, wherein the passage way is provided above the maintenance zone.

17. The vacuum processing system according to claim 16, further comprising a supporting surface disposed below the maintenance zone, wherein
the supporting surface, the first chamber, the passage way, and the second chamber fully surround the maintenance zone, and
the maintenance zone is configured to provide access to the first chamber and the second chamber along an unobstructed path extending along the supporting surface.

18. The vacuum processing system according to claim 1, wherein a distance between the first chamber and the second chamber inside the maintenance zone is between 1 m and 3 m.

19. The vacuum processing system according to claim 1, wherein loading/unloading system comprises a gripping device configured to grip the supply roll and the take-up roll.

20. A vacuum processing system for a flexible substrate, the vacuum processing system comprising:
a first chamber adapted for housing one of a supply roll for providing the flexible substrate and a take-up roll for storing the flexible substrate;
a second chamber adapted for housing one of the supply roll for providing the flexible substrate and the take-up roll for storing the flexible substrate;
a maintenance zone comprising a table, the maintenance zone located entirely between the first chamber and the second chamber, wherein the maintenance zone is configured to operate at atmospheric pressure during vacuum processing of the flexible substrate; and
a first process chamber for depositing material on the flexible substrate, wherein
the second chamber is provided between the maintenance zone and the first process chamber,
the first chamber and the second chamber are separate chambers,
the maintenance zone allows for maintenance access inside the first chamber and the second chamber, and
the table is configured to support the supply roll and the take-up roll during insertion and removal through the maintenance zone of the supply roll and the take-up roll to and from the corresponding first chamber and second chamber.

\* \* \* \* \*